United States Patent
Leuciuc

(10) Patent No.: US 9,924,466 B1
(45) Date of Patent: Mar. 20, 2018

(54) DYNAMIC FLIP-FLOP AND MULTIPLEXER FOR SUB-RATE CLOCK DATA SERIALIZER

(71) Applicant: Cadence Design Systems, Inc., San Jose, CA (US)

(72) Inventor: Adrian Luigi Leuciuc, Frederick, MD (US)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 325 days.

(21) Appl. No.: 14/709,395

(22) Filed: May 11, 2015

(51) Int. Cl.
  H03K 19/00 (2006.01)
  H04W 52/02 (2009.01)
  H03K 3/3562 (2006.01)
  H03K 19/017 (2006.01)
  H03K 19/096 (2006.01)
  H03K 3/356 (2006.01)

(52) U.S. Cl.
  CPC ........ H04W 52/029 (2013.01); H03K 3/3562 (2013.01); *H03K 3/356139* (2013.01); *H03K 3/356156* (2013.01); *H03K 19/0013* (2013.01); *H03K 19/0016* (2013.01); *H03K 19/01728* (2013.01); *H03K 19/096* (2013.01); *H03K 19/0963* (2013.01)

(58) Field of Classification Search
  None
  See application file for complete search history.

(56) References Cited

U.S. PATENT DOCUMENTS

| | | | | |
|---|---|---|---|---|
| 5,592,114 A | * | 1/1997 | Wu | H03K 19/0963 327/208 |
| 6,737,900 B1 | * | 5/2004 | Wu | H03K 19/0963 210/211 |
| 7,489,174 B2 | * | 2/2009 | Yoshizawa | H03K 5/15093 327/199 |

(Continued)

OTHER PUBLICATIONS

Zhong et al., "A 1.0625-14.025 Gb/s Multi-Media Transceiver With Full-Rate Source-Series-Terminated Transmit Driver and Floating-Tap Decision-Feedback Equalizer in 40 nm CMOS", IEEE Journal of Solid-State Circuits, vol. 46, No. 12, Dec. 2011, pp. 3126-3139.

(Continued)

*Primary Examiner* — Tuan T Lam
(74) *Attorney, Agent, or Firm* — Andrews Kurth Kenyon LLP

(57) ABSTRACT

Methods and systems provide a multiplexing cell and a multiplexing cell system for data serialization. The multiplexing cell may be dynamic D-type flip flop having a single phase clock signal (CLK) and a select input (SEL). An input to the multiplexing cell may be passed to an output if CLK is high and SEL are both high. Otherwise, the output of each multiplexing cell may be in a high impedance state. A multiplexing cell system may include one or more of the multiplexing cells and be configured to provide serialization of input data at high data rates with reduced power consumption. Sub-rate clocks, which may be used by at least a portion of a serialization chain, may reduce power consumption allow for less complex clock generation and distribution circuitry. The multiplexing cell and/or multiplexing cell (Continued)

system find application in, among other things, equalization to offset effects of channel imperfections.

20 Claims, 12 Drawing Sheets

(56) References Cited

U.S. PATENT DOCUMENTS

| | | | | |
|---|---|---|---|---|
| 2003/0062941 | A1* | 4/2003 | Kim | H03K 19/0963 327/218 |
| 2003/0210085 | A1* | 11/2003 | Larsson | H03K 19/0963 327/211 |
| 2005/0242861 | A1* | 11/2005 | Kanda | H03K 3/356113 327/218 |
| 2006/0022714 | A1* | 2/2006 | Ramaraju | H03K 19/0963 326/96 |
| 2006/0082405 | A1* | 4/2006 | Chatterjee | H03K 3/356121 327/218 |
| 2008/0106315 | A1* | 5/2008 | Jau | H03K 19/0963 327/200 |
| 2009/0160517 | A1* | 6/2009 | Yeh | H03K 3/356104 327/212 |

OTHER PUBLICATIONS

B. Raghavan et al., "A Sub-2W 39.88-44.6 Gb/s Transmitter and Receiver Chipset with SFI-5.2 Interface in 40nm CMOS", IEEE Journal of Solid-State Circuits, vol. 48, No. 12, Dec. 2013, pp. 3219-3228.

J. F. Bulzachelli et al., "28-Bg/s 4-Tap FFE/15-Tap DFE Serial Link Transceiver in 32-nm SOI CMOS Technology", IEEE Journal of Solid-State Circuits, vol. 47, No. 12, Dec. 2012, pp. 3232-3248.

\* cited by examiner 100
(Prior Art)

300
(Prior Art)

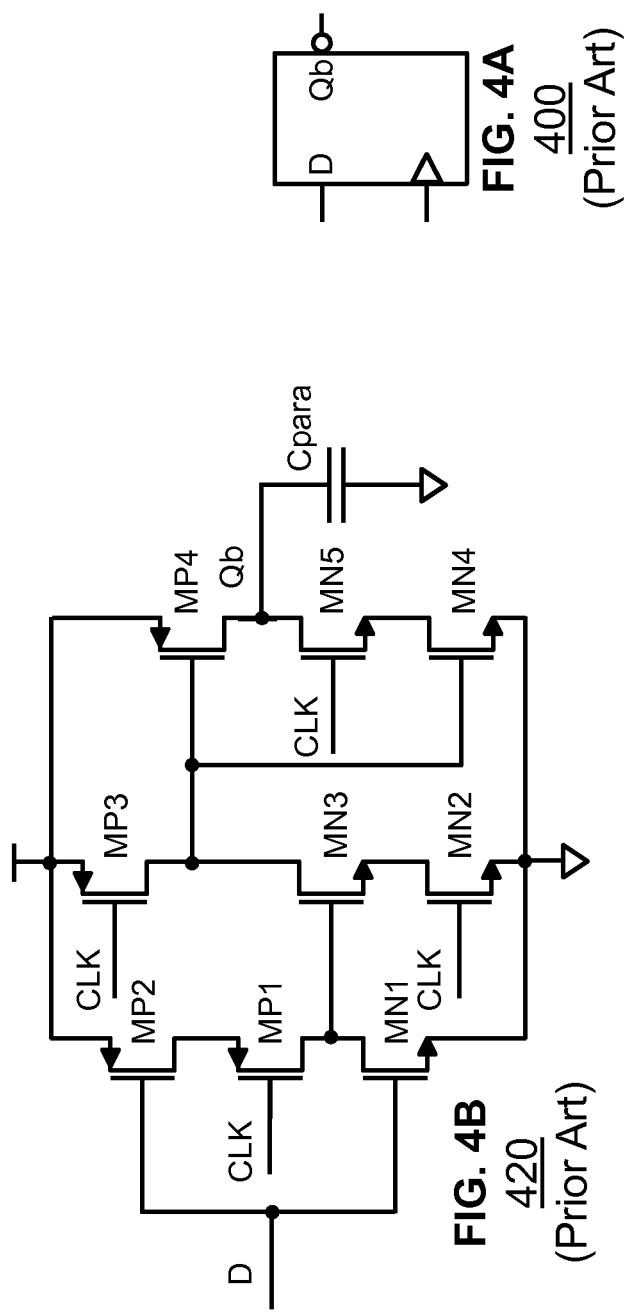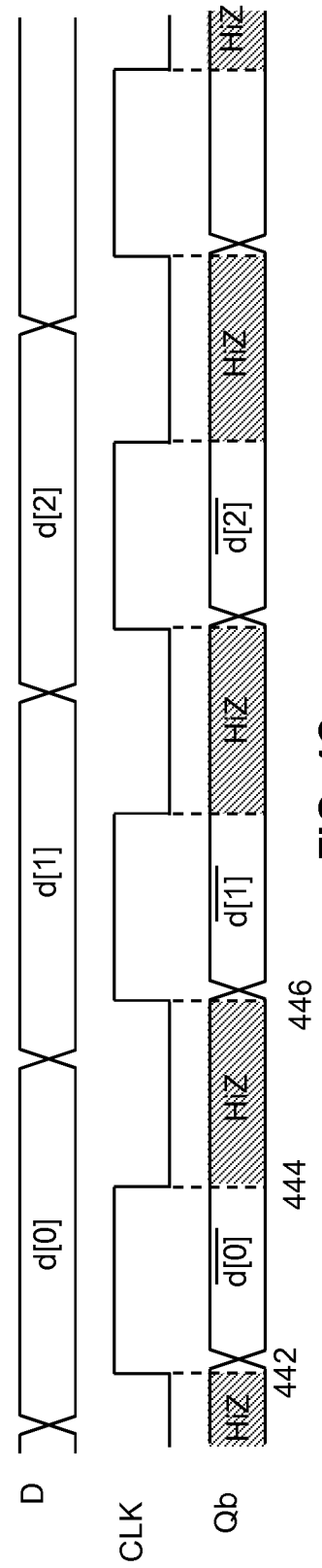
FIG. 4A
400
(Prior Art)
FIG. 4B
420
(Prior Art)
FIG. 4C
440
(Prior Art)

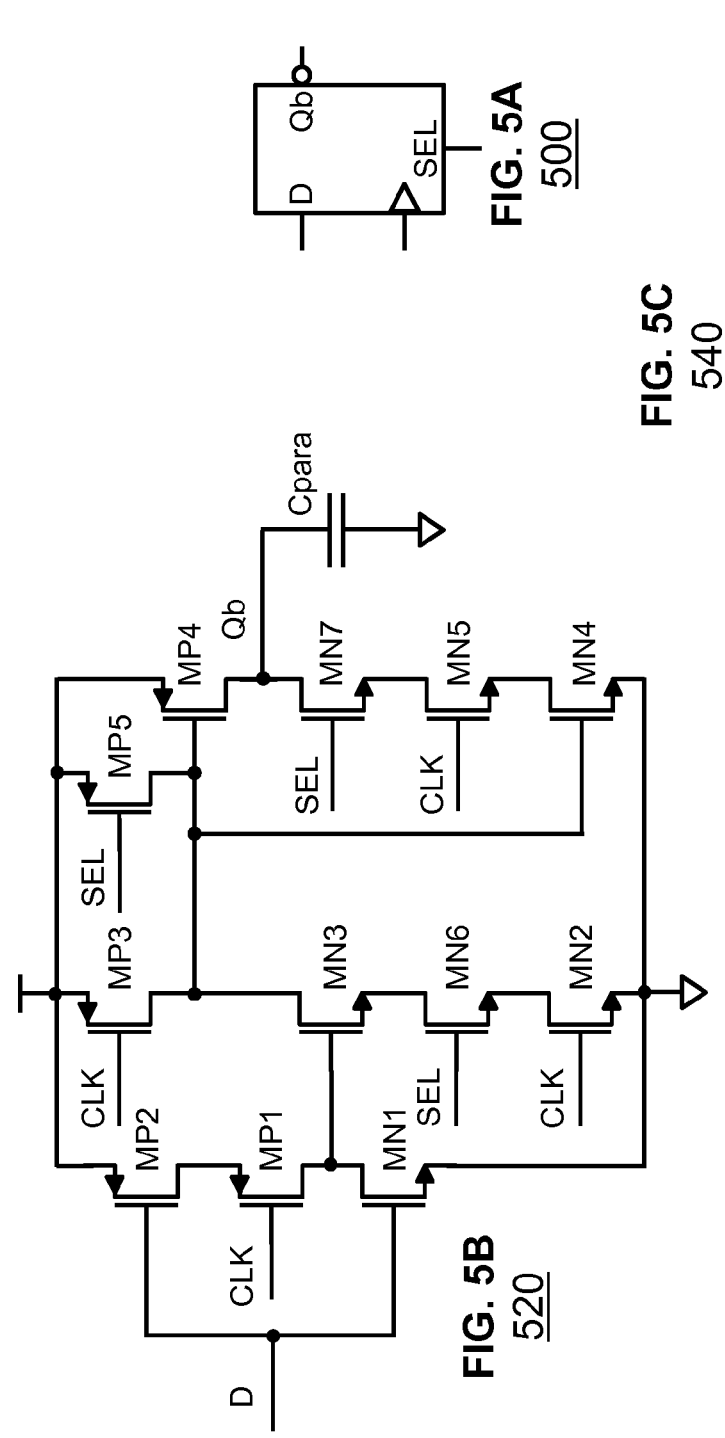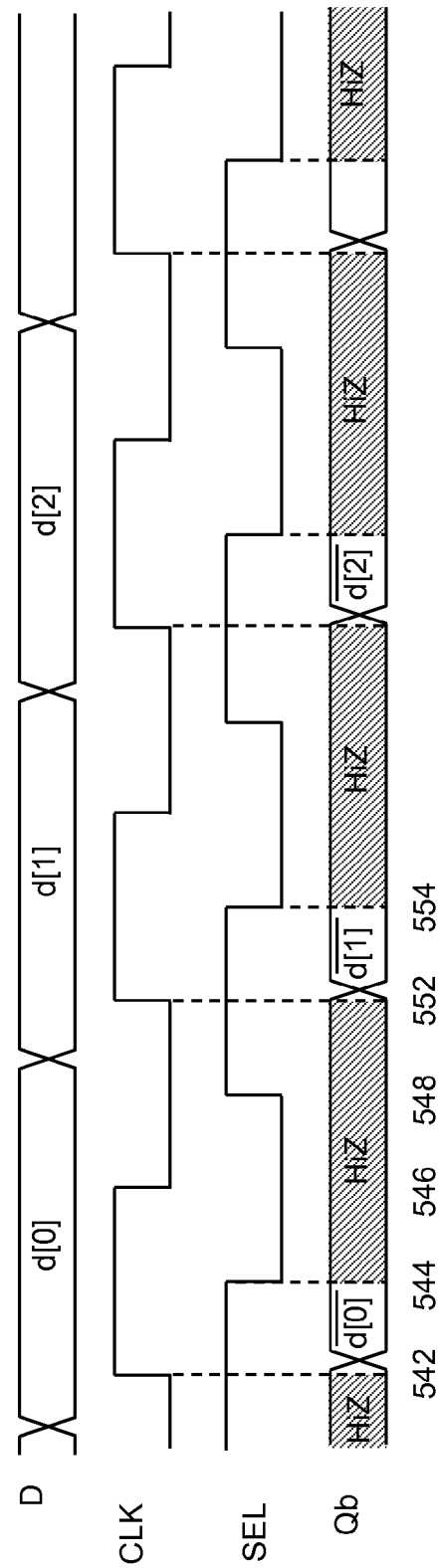

600

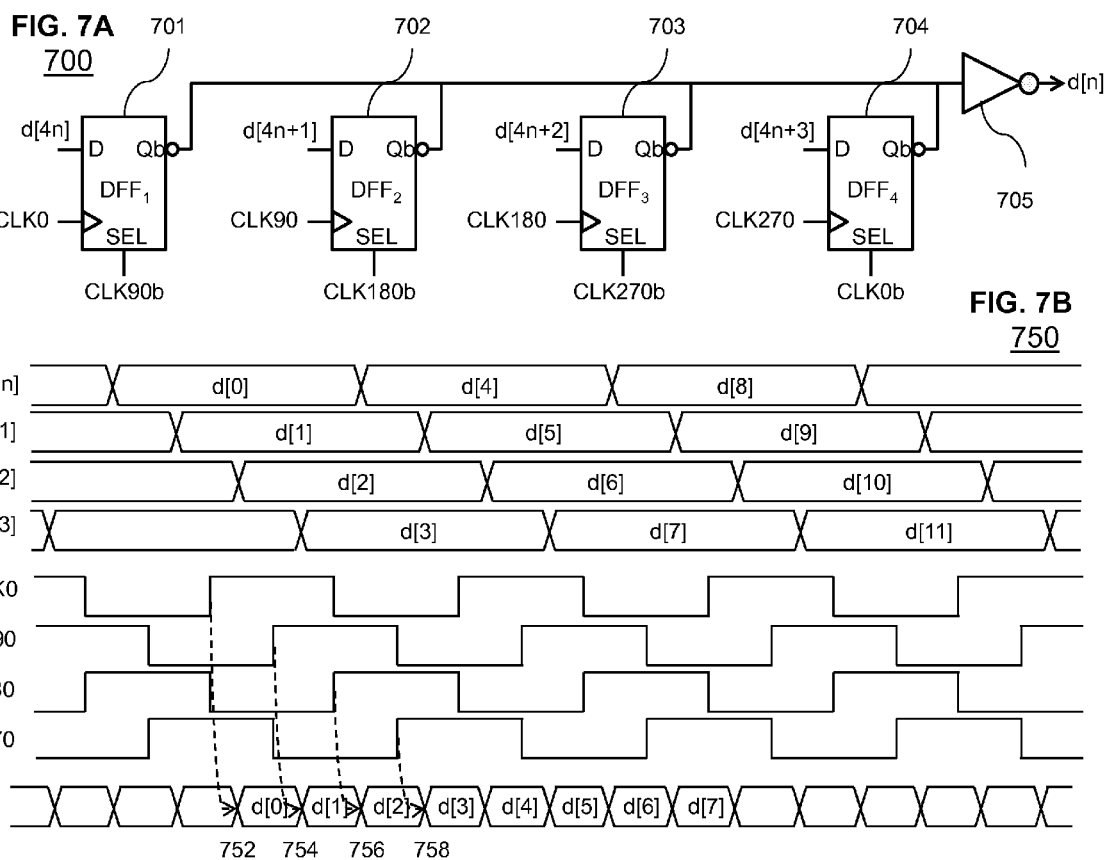

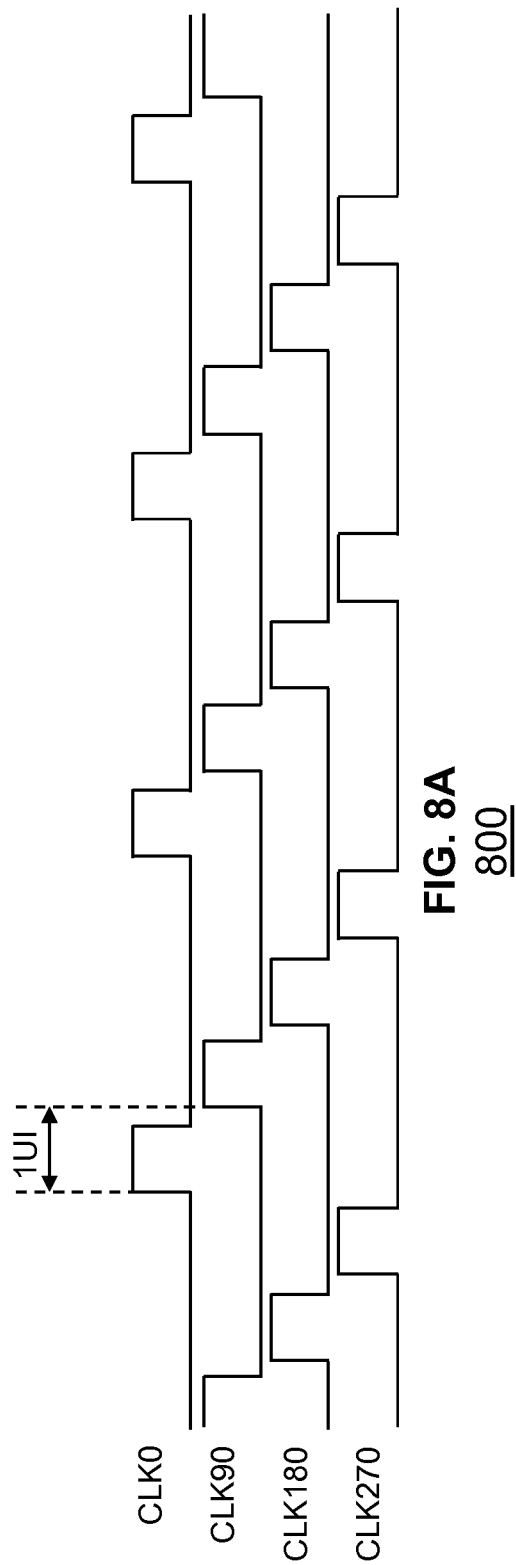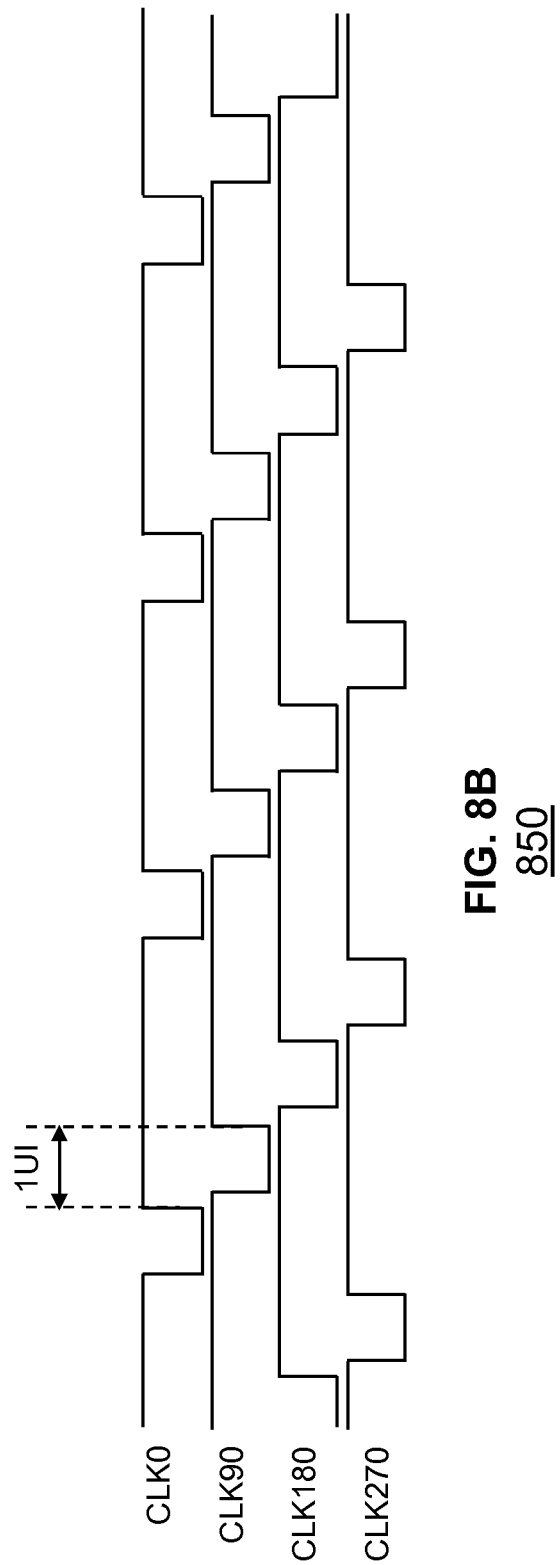

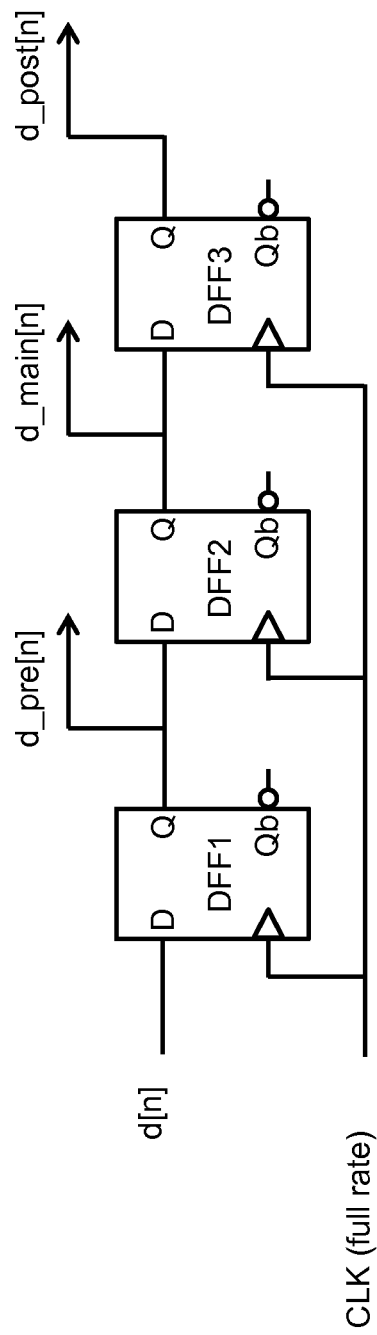
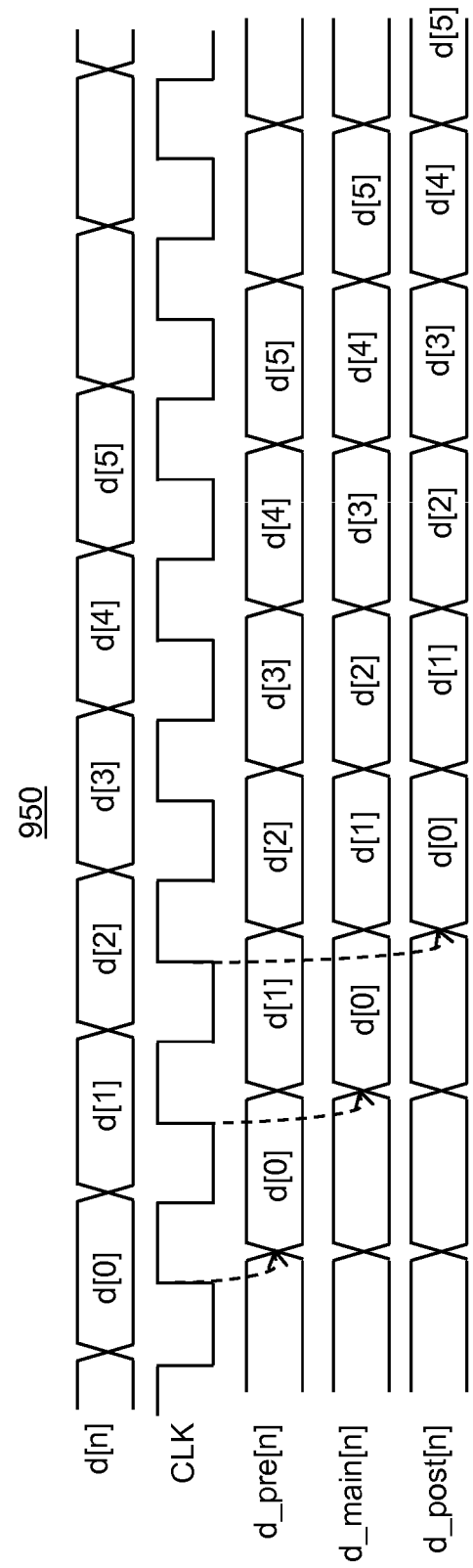
FIG. 9
900
(Prior Art)

1000

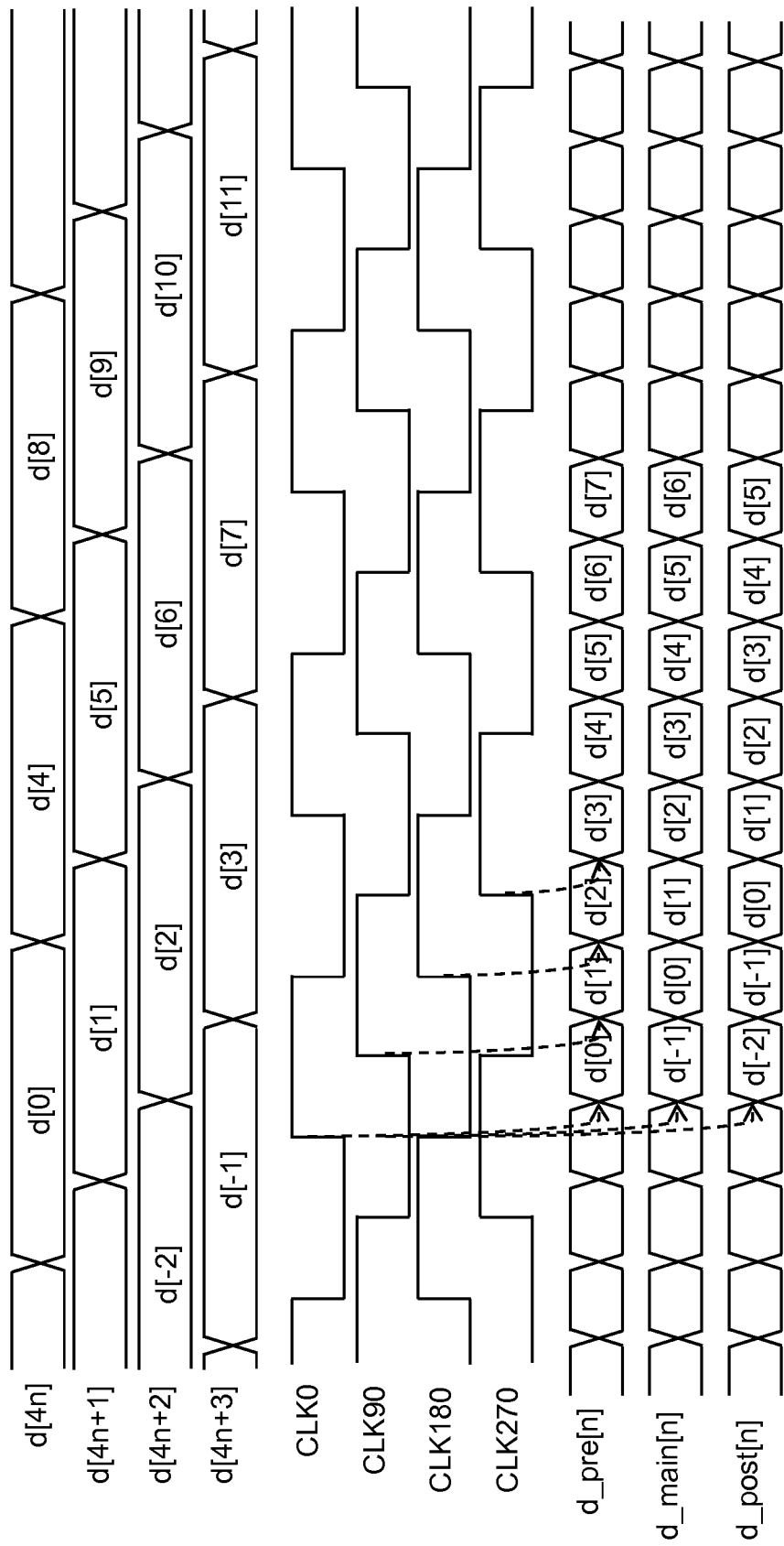

1100

1150

US 9,924,466 B1

DYNAMIC FLIP-FLOP AND MULTIPLEXER FOR SUB-RATE CLOCK DATA SERIALIZER

FIELD OF THE DISCLOSURE

The present disclosure relates to data communications. More specifically, it relates to a data multiplexing cell and a data multiplexing cell system for data serialization.

BACKGROUND

As the Internet and other communications networks continue to mature, high volume and high data bit-rate activities such as multimedia streaming and cloud computing are becoming more popular. To accommodate these wide data bandwidth applications, faster network services are required. To facilitate network services, network routers and servers typically include a serializer-deserializer system (SerDes). A SerDes includes a serial data link transceiver. A transceiver includes: (i) a receiver (RX), which receives high speed serial data and parallelizes the serial data into lower frequency, multi-bit data words and (ii) a transmitter (TX) which serializes multi-bit data words into high rate single-bit streams that can be sent over a serial communication channel.

FIG. 1 is a simplified block diagram of a conventional transmitter 100. The transmitter 100 is a serial data link, differential output transmitter. The transmitter 100 includes a serializer 101 and an output driver 102. The serializer 101 converts input parallel data into a serial data stream. The serial data is synchronized using the clock signal CLK. The output driver 102 may then send the serial data over a communication channel. The output serial data may be a differential signal with components TX_P and TX_M.

A conventional way to implement the serializer 101 is to use an N-bit shift register with parallel load. FIG. 2 shows an N-bit shift register 200 along with a corresponding timing diagram 250. The shift register 200 includes N two-input digital multiplexers (MUXs) 201 and N D-type flip-flops (DFFs) 202. N-bit parallel data is loaded into the DFFs when a LOAD signal is high. At every rising edge of the CLK signal, the data is shifted to the right, one bit at a time, generating the output serial data. The LOAD signal may be obtained by dividing the main CLK signal by N. However, the shift register 200 becomes impractical to use at higher data rates because of, among other things, the finite propagation delay of DFFs, finite hold and setup times of DFFs, and its large power consumption.

One way of handling higher data rates is to perform serialization of input parallel data in multiple steps. FIG. 3 shows a two-step data serialization system 300. The serialization system 300 may include shift registers 301, a serializer 302, and a line driver 303. An N-bit parallel bus is split into M smaller buses, each N/M-bit wide. M is selected to be a factor of N, such that N/M has an integer value. Each N/M-bit data bus is serialized by the shift registers 301 operating at a rate M times smaller than the rate of the system 300. The outputs of the M shift registers 301 are combined into an M-bit wide data bus, which is transformed into a one-bit stream by an M-bit serializer 302 before being applied to the input of a line driver 303. The line driver 303 may output the serial data in the form of a differential signal with components TX_P and TX_M.

The second stage serializer 302 may be implemented in a variety of ways using data multiplexers and latches. Sometimes the last step of the serialization operation is performed in the output line driver itself. However, since the output serial data needs to be synchronous, either a full rate clock, or a half rate clock with a duty cycle equal to 50% is used. When using a full rate clock, the serial data is synchronized with either edge of the full rate clock. When using a half rate clock with a 50% duty cycle, the data is synchronized alternately with the rising and falling edges of the clock. The generation and distribution of such high frequency clocks is difficult and consumes a large amount of power. Thus, there exists a need in the art to simplify clock generation and distribution circuitry and to reduce the power consumption of SerDes systems.

BRIEF DESCRIPTION OF THE DRAWINGS

FIG. 4A is a schematic symbol of a dynamic D-type flip-flop (DFF) having a single phase clock.

FIG. 4B is a schematic of a dynamic DFF having a single phase clock.

FIG. 4C is a timing diagram of a dynamic DFF having a single phase clock.

FIG. 5A is a schematic symbol of a dynamic DFF having a single phase clock and a select input according to an embodiment.

FIG. 5B is a simplified schematic of a dynamic DFF having a single phase clock and a select input according to an embodiment (the dynamic multiplexing cell).

FIG. 5C is a timing diagram of a dynamic DFF having a single phase clock and a select input according to an embodiment.

FIG. 7A is a simplified schematic of a 4:1 serializer including a dynamic multiplexing cell according to an embodiment.

FIG. 7B is a timing diagram of a simplified 4:1 serializer including a dynamic multiplexing cell according to an embodiment.

FIG. 8A is a timing diagram illustrating one type of unbalanced clock signal.

FIG. 8B is a timing diagram illustrating another type of unbalanced clock signal.

FIG. 9 is a simplified schematic diagram of a three-stage shift register generating the delayed data used for transmitter equalization and a corresponding timing diagram.

FIG. 10B is a timing diagram of a 4:1 serializer generating three streams of delayed data used for TX equalization according to an embodiment.

DETAILED DESCRIPTION

Figure 1:
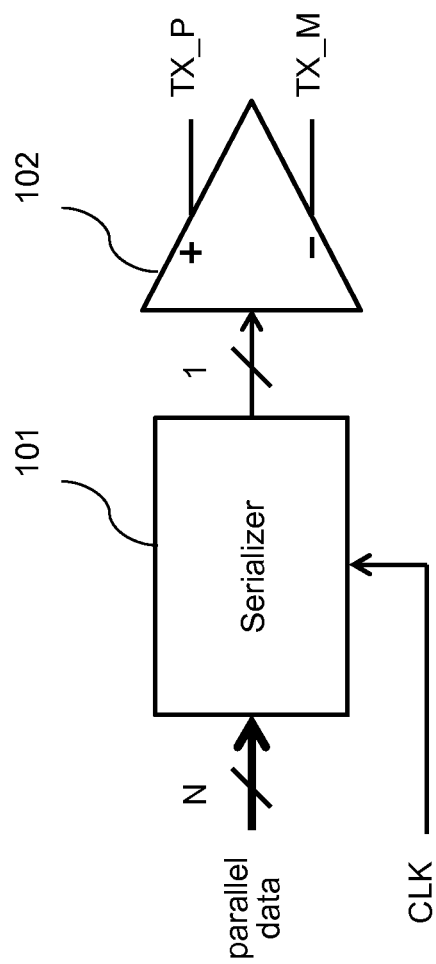
FIG. 1 is a simplified block diagram of a serial data link, differential output transmitter.
Figure 2:
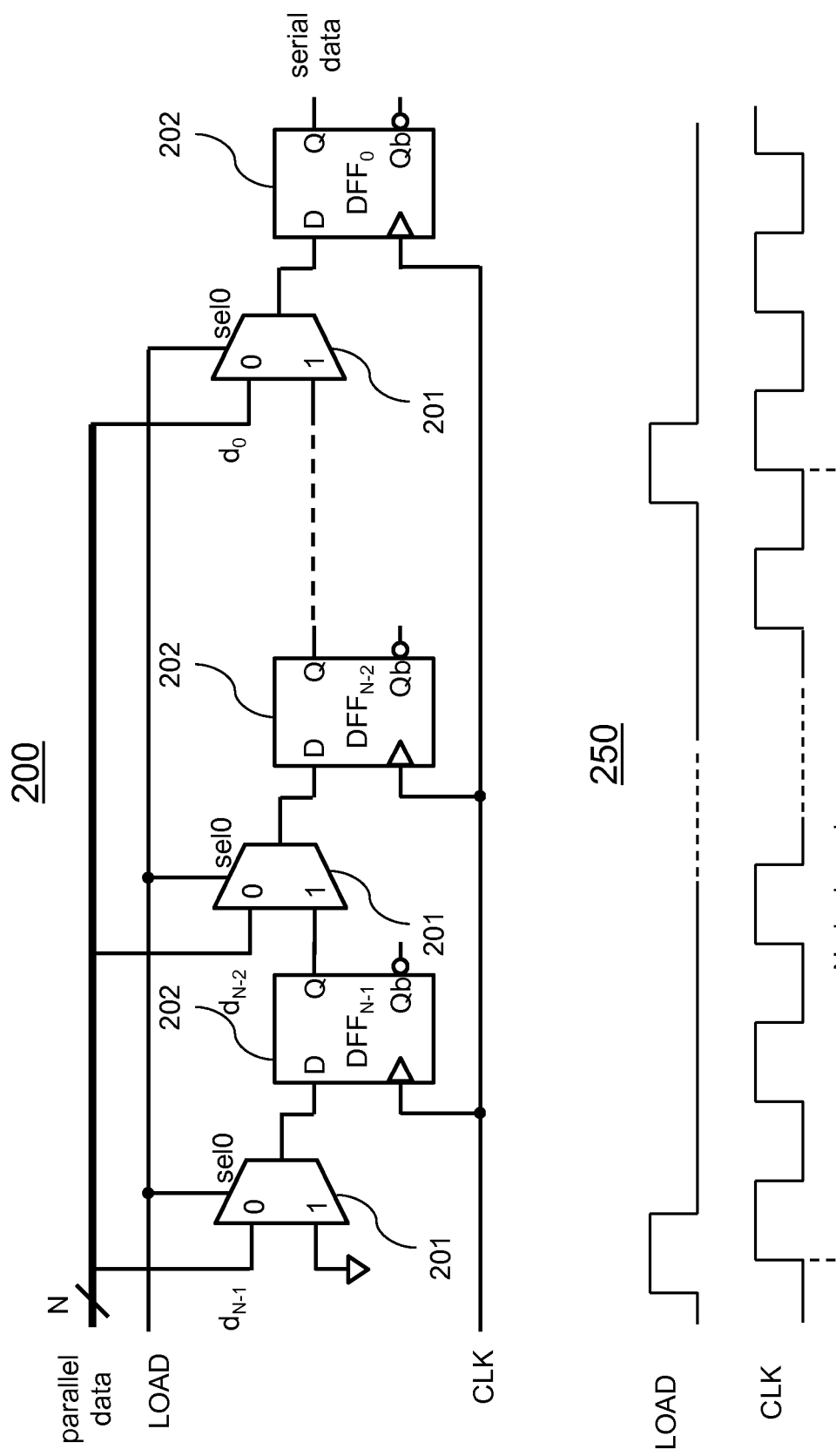
FIG. 2 is a simplified schematic of a shift register with parallel load and corresponding timing diagram.
Figure 3:
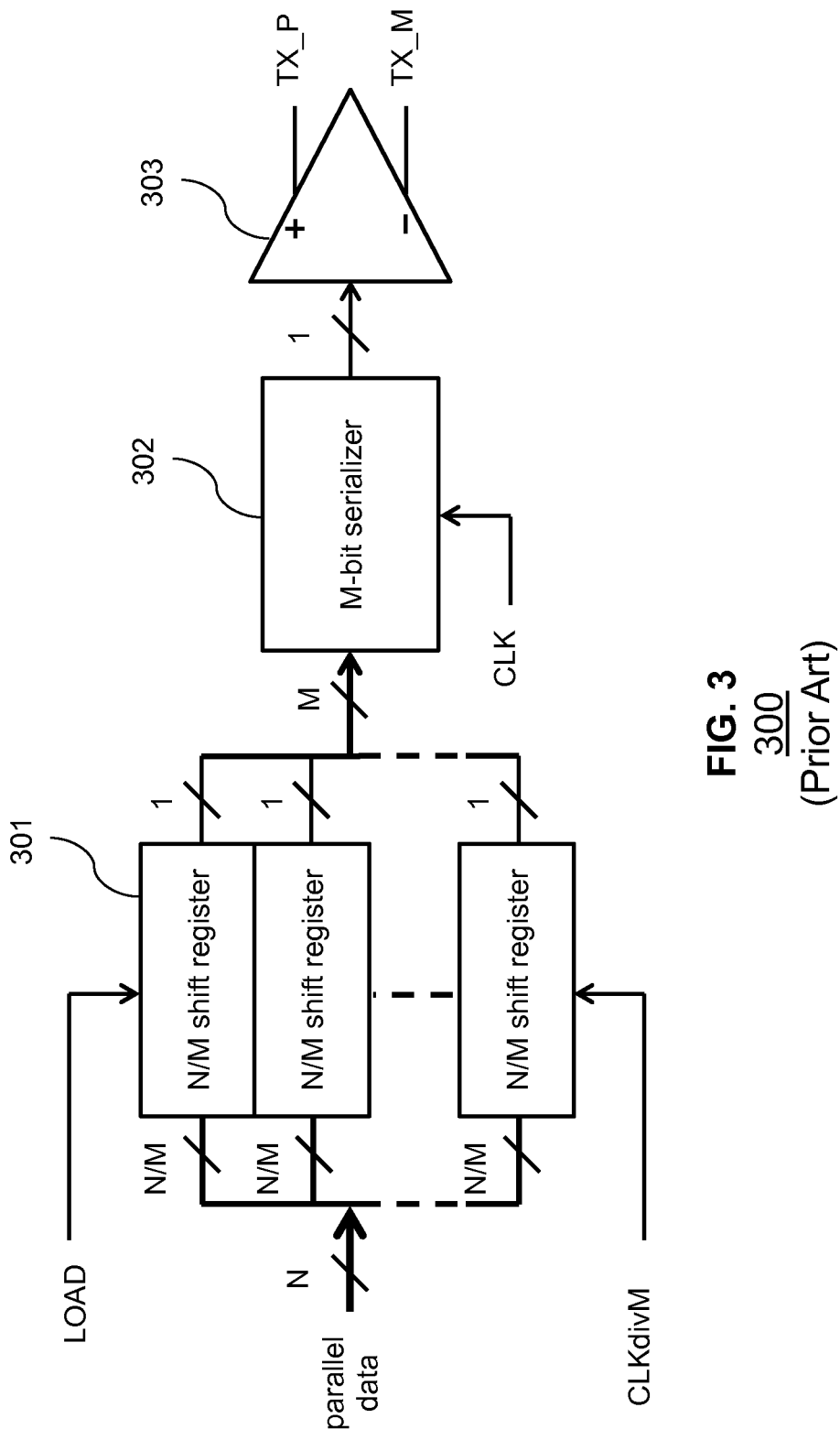
FIG. 3 is a simplified block diagram of a serializer having two stages.

In one aspect, embodiments of the present disclosure provide sub-rate clocks, which may be used by a serialization chain to reduce power consumption and to employ less complex clock generation and distribution circuitry. In another aspect, embodiments of the present disclosure allow for relaxed restrictions on a duty cycle value of a clock signal. In another aspect, embodiments of the present disclosure provide one unit interval (UI) delayed data streams used for transmitter (TX) equalization to offset effects of channel imperfections.

FIG. 4A is a schematic symbol 400 of a dynamic D-type flip-flop (DFF) having a single phase clock. The schematic symbol 400 is a representation of inputs and output to the DFF. The schematic symbol includes an input for receiving input data D, an input for a clock signal CLK, and an output for outputting data Qb.

FIG. 4B is a schematic of a dynamic DFF 420 having a single phase clock. The DFF 420 is a positive-edge triggered, true single phase clock (TSPC) DFF. That is, the DFF 420 requires only one clock signal and need not use the complement of the clock signal. The DFF 420 may include a master latch. The master latch may be implemented by transistors MP2, MP1, and MN1. The master latch may receive data D as input. As shown, the transistors MP2 and MN1 may receive input D at respective gates. The output of the master latch may be obtained at a node joining respective drains of MP1 and MN1.

The DFF may include transistors MP3, MN3, MN2, MP4, MN5, and MN4. The transistors MP1, MP3, MN2, and MN5 may receive CLK at a respective gate. A respective source of each of the transistors MP2, MP3, and MP4, may be tied to a supply voltage. A respective source of each of the transistors MN1, MN2 and MN4 may be tied to ground. A drain of the transistor MP1 may be tied to a gate of the transistor MN3. In other words, an output of the master latch may be passed to the gate of the transistor MN3. A drain of the transistor MP3 may be tied to a gate of the transistor MP4. Respective gates of the transistors MP4 and MN4 may be tied to each other. The output Qb may be obtained from a node joining the respective drains of the transistors MP4 and MN5. As shown, a parasitic capacitance of the DFF 420 is represented as Cpara.

The DFF 420 may be in a first mode of operation when CLK is low. In the first mode of operation, (i) input data is loaded into the master latch (MN1, MP1, and MP2) and (ii) the output Qb of the DFF is in a high impedance state (i.e. the output is floating, because both MP4 and MN5 are off). During the first mode of operation, if no other circuitry drives node Qb, the parasitic capacitance Cpara maintains its voltage for a period of time that is a function of the value of the parasitic capacitance and the leakage current discharging it.

The DFF 420 may be in a second mode of operation when CLK is high. In the second mode of operation, the master latch goes into a high impedance mode, preserving the value of the voltage at its output. The voltage at node Qb is set by the voltage at the output of the master latch when CLK makes its transition. More specifically, the output of the master latch is the complement of the input signal D when CLK has its positive transition.

FIG. 4C is a timing diagram 440 illustrating the operation of the DFF 420. The timing diagram 440 shows a data signal including a series of data inputs, d[0], d[1], and d[2]. The timing diagram 440 also shows an output Qb signal and CLK signal, which may cycle between high and low. The output Qb signal may be based on the data inputs d[0], d[1], and d[2] at times and may be of high impedance as other times, as further discussed herein.

Beginning at the left, in the first mode of operation, CLK is low and input data is data preceding d[0] (not shown). The input data is loaded into the master latch. Qb is in a high impedance mode, represented by the shaded "HiZ" portion. At 442, CLK transitions from low to high. This transition is also referred to as a positive edge of the clock, and corresponds to a transition from the first mode of operation to the second mode of operation. As shown in timing diagram 440, sometime before the transition at 442, the input data becomes d[0]. Thus, in the second mode of operation (when the CLK is high), the output of the master latch is the complement of the input signal, i.e., $\overline{d[0]}$ and the master latch preserves this value of the voltage at its output. Around the moment of the transition from the first mode of operation to the second mode of operation, the voltage at node Qb is set by the voltage at the output of the master latch, i.e., Qb is $\overline{d[0]}$.

At 444, the CLK transitions from high to low. This causes the DFF to enter the first mode of operation. Qb enters into a high impedance mode, represented by the shaded "HiZ" portion. At 446, the CLK transitions from low to high. This causes the DFF to enter the second mode of operation. As shown in timing diagram 440, sometime before the transition at 446, the input data becomes d[1]. Thus, in the second mode of operation (when the CLK is high), the output of the master latch is the complement of the input signal, i.e., $\overline{d[1]}$, and the master latch preserves this value of the voltage at its output. Around the moment of the transition from the first mode of operation to the second mode of operation, the voltage at node Qb is set by the voltage at the output of the master latch, i.e., Qb is $\overline{d[1]}$.

Each of the high impedance states of the DFF (represented as "HiZ" in FIG. 4C) may be exploited for multiplexing digital data. When the DFF is in the high impedance state, its output node Qb may be driven with other circuits that, at their turn, are in high impedance states when the DFF is actively driving those other circuits. By way of non-limiting example, two DFFs may be connected in parallel and operated to have a multiplexing effect. However, the falling edge of the clock signal CLK is typically unreliable. For instance, the falling edge of CLK is unreliable for putting the DFF into the high impedance state. The falling edge of a CLK may be unreliable for a variety of reasons. For example, the duration of a CLK high or CLK low is not usually controlled tightly, and correspondingly the falling edge is usually not controlled as tightly.

Methods and systems of the present disclosure provide a circuit that may be driven by a single edge rather than both edges of a clock signal. Thus, a falling edge of a clock signal need not be relied on to accurately handle high bit-rate data while consuming low power. In an embodiment, a multiplexing cell may include a master latch for receiving an input signal and a clock signal, a second stage for receiving the clock signal and a select signal, and an output stage to receive the clock signal and the select signal. The output stage may be configured to output a signal responsive to a determination that the clock signal and the select signal are both high. The output signal may be a complement of the input signal.

In another embodiment, a serializer includes a first multiplexing cell and a second multiplexing cell, each receiving a respective input data stream. The multiplexing cells may each include a clock input to receive a clock signal, a selection input to receive a select signal; and an output. The first and second multiplexing cells each may be configured to output a signal responsive to a determination that the respective clock signal and the respective select signal are both high. The first multiplexing cell may be in a high impedance mode while the second multiplexing cell provides the second output, and the second multiplexing cell may be in a high impedance mode while the first multiplexing cell provides the first output such that the parallel data is multiplexed.

In another embodiment, a method to serialize parallel data by a multiplexing system including at least one multiplexing cell, may include receiving an input data stream. The method may further include receiving a clock signal. The method may further include receiving a selection signal, wherein the selection signal is offset from the clock signal. The method may further include outputting data while the selection signal is high, wherein the data reflects a value of the input data stream at a most recent positive edge of the clock signal.

FIG. 5A is a schematic symbol of a dynamic DFF 500 having a single phase clock and a select input by way of non-limiting embodiment. The schematic symbol 500 shows input for receiving input data D, input for receiving a clock signal CLK, an input for receiving a selection signal SEL, and an output for outputting a signal Qb.

FIG. 5B is a simplified schematic of a dynamic DFF 500 having a single phase clock and a select input by way of non-limiting embodiment. In comparison to the DFF 420, the DFF 520 may include an additional control signal SEL (also referred to as "a select input") and additional transistors MP5, MN6, and MN7. The DFF 520 may include a first stage (also referred to as a "master latch"). The master latch may be implemented by transistors MP2, MP1, and MN1. The master latch may receive data D as input. As shown, the transistors MP2 and MN1 may receive input D at respective gates. The output of the master latch may be obtained at a node joining respective drains of MP1 and MN1.

The DFF may include transistors MP3, MN3, MN2, MP4, MN5, MN4, MP5, MN6, and MN7. In an embodiment, a second stage may include the transistors MP3, MN3, MN6, and MN2, and an output stage may include the transistors MP5, MP4, MN7, MN5, and MN4. The transistors MP1, MP3, MN2, and MN5 may receive a clock signal CLK at respective gates. The transistors MP5, MN6, and MN7 may receive SEL at respective gates. A respective source of each of the transistors MP2, MP3, MP4, and MP5 may be tied to a supply voltage. A respective source of each of the transistors MN1, MN2 and MN4 may be tied to ground. A drain of the transistor MP1 may be tied to a gate of the transistor MN3. In other words, an output of the master latch may be passed to the gate of the transistor MN3. A source of the transistor MN3 may be tied to a drain of the transistor MN6. A source of the transistor MN6 may be tied to a drain of the transistor MN2. A drain of the transistor MP3 may be tied to a gate of the transistor MP4 and a drain of the transistor MP5. Respective gates of the transistors MP4 and MN4 may be tied to each other. A source of the transistor MN7 may be tied to a drain of the transistor MN5. The output Qb may be obtained from a node joining respective drains of the transistors MP4 and MN7. As shown, parasitic capacitance of the DFF 520 is represented as Cpara.

The DFF 520 may be in a first mode of operation when CLK is low (regardless of a value of SEL). In the first mode of operation, (i) input data is loaded into the master latch (MN1, MP1, and MP2) and (ii) the output Qb of the DFF is in a high impedance state. During the first mode of operation, if no other circuitry drives node Qb, the parasitic capacitance Cpara maintains its voltage for a period of time that is a function of the value of the parasitic capacitance and the leakage current discharging it.

The DFF 520 may be in a second mode of operation when CLK is high and SEL is low. In an embodiment the DFF 520 may enter the second mode of operation at a falling edge of SEL. In the second mode of operation, the output of the DFF 520 goes into a high impedance state.

The DFF 520 may be in a third mode of operation when CLK and SEL are both high. In the third mode of operation, the master latch may enter into a high impedance state, preserving the value of the voltage at its output. The voltage at node Qb is set by the voltage at the output of the master latch when CLK makes its transition. More specifically, the output of the master latch is the complement of the input signal D when CLK had its positive transition.

In summary, the operation of the DFF 520 may be controlled by the rising edge of CLK and by the falling edge of SEL. Table 1 summarizes the behavior of the DFF 520 in each of the modes of operation.

TABLE 1

| Mode | CLK | SEL | D | Qb |
| --- | --- | --- | --- | --- |
| 1 | Low | Low | d[n] | HiZ |
| 1 | Low | High | d[n] | HiZ |
| 2 | High | Low (Falling) | X | HiZ |
| 3 | High | High | X | $\overline{d[n]}$ |

FIG. 5C is a timing diagram 540 illustrating the operation of the DFF 520. The timing diagram 540 shows a data signal including a series of data inputs, d[0], d[1], and d[2]. The timing diagram 540 also shows a CLK signal, which may cycle between high and low, a SEL signal which may also cycle between high and low, and an output Qb signal. The SEL signal may cycle between high and low at a different frequency compared with the CLK signal. The duration of high and low also may be different for CLK and SEL. The output Qb signal may reflect the data inputs d[0], d[1], and d[2] at times and may be of high impedance as other times, as further discussed herein.

Beginning at the left, in the first mode of operation, CLK is low and SEL is high and input data is data preceding d[0] (not shown). The input data is loaded into the master latch. Qb is in a high impedance mode, represented by the shaded "HiZ" portion.

At 542, CLK transitions from low to high, while SEL remains high. This transition is also referred to as a rising edge or positive edge of the clock. This causes the DFF 520 to enter the third mode of operation. As shown in the timing diagram 540, sometime before the transition at 542, the input data becomes d[0]. Thus, in the third mode of operation (when CLK is high and SEL is high), the output of the master latch is the complement of the input signal D, $\overline{d[0]}$ and the master latch preserves this value of the voltage at its output. Around the moment of the transition from the first mode of operation to the third mode of operation, the voltage at node Qb is set by the voltage at the output of the master latch, i.e., Qb is $\overline{d[0]}$.

At 544, CLK remains high, while SEL transitions from high to low. This causes the DFF 520 to enter the second mode of operation. This transition is also referred to as a falling edge or negative edge of SEL. Thus, the output of the DFF 520 goes into a high impedance state (represented by the shaded "HiZ").

At 546, CLK transitions from high to low while SEL remains low. This causes the DFF 520 to enter the first mode of operation. In an embodiment, Qb enters into a high impedance state, represented by the shaded "HiZ" portion. In an embodiment, Qb remains in a high impedance mode.

At 548, the CLK remains low while the SEL transitions from low to high. This causes the DFF 520 to remain in the first mode of operation. Thus, Qb remains in a high impedance mode, represented by the shaded "HiZ" portion.

At 552, CLK transitions from low to high while SEL remains high. This causes the DFF 520 to enter the third mode of operation. As shown in the timing diagram 540, sometime before the transition at 552, the input data becomes d[1]. Thus, in the third mode of operation, the output of the master latch is the complement of the input signal D, $\overline{d[1]}$, and the master latch preserves this value of the voltage at its output. Around the moment of the transition from the first mode of operation to the third mode of operation, the voltage at node Qb is set by the voltage at the output of the master latch, i.e., Qb is $\overline{d[1]}$.

At 554, CLK remains high while SEL transitions from high to low. The falling edge of the SEL and the high CLK causes the DFF 520 to enter into the second mode of operation, in which the output of the DFF 520 goes into a high impedance state (represented by the shaded "HiZ").

In summary, the DFF 520 uses a falling edge of a SEL signal in addition to a CLK signal to more precisely control a high impedance state of the DFF output. In one aspect, this may increase a duration of a high impedance state, allowing for better control and more advanced multiplexing of data.

In another aspect, embodiments of the present disclosure allow for relaxed restrictions on a duty cycle value of a clock signal. Typical methods using a sub-rate clock require control of both edges of a clock signal, i.e., duty cycle correction, which may be power intensive. In an embodiment of the present disclosure, only one edge of the clock signal is used to save power and relax duty cycle requirements.

Figure 6:
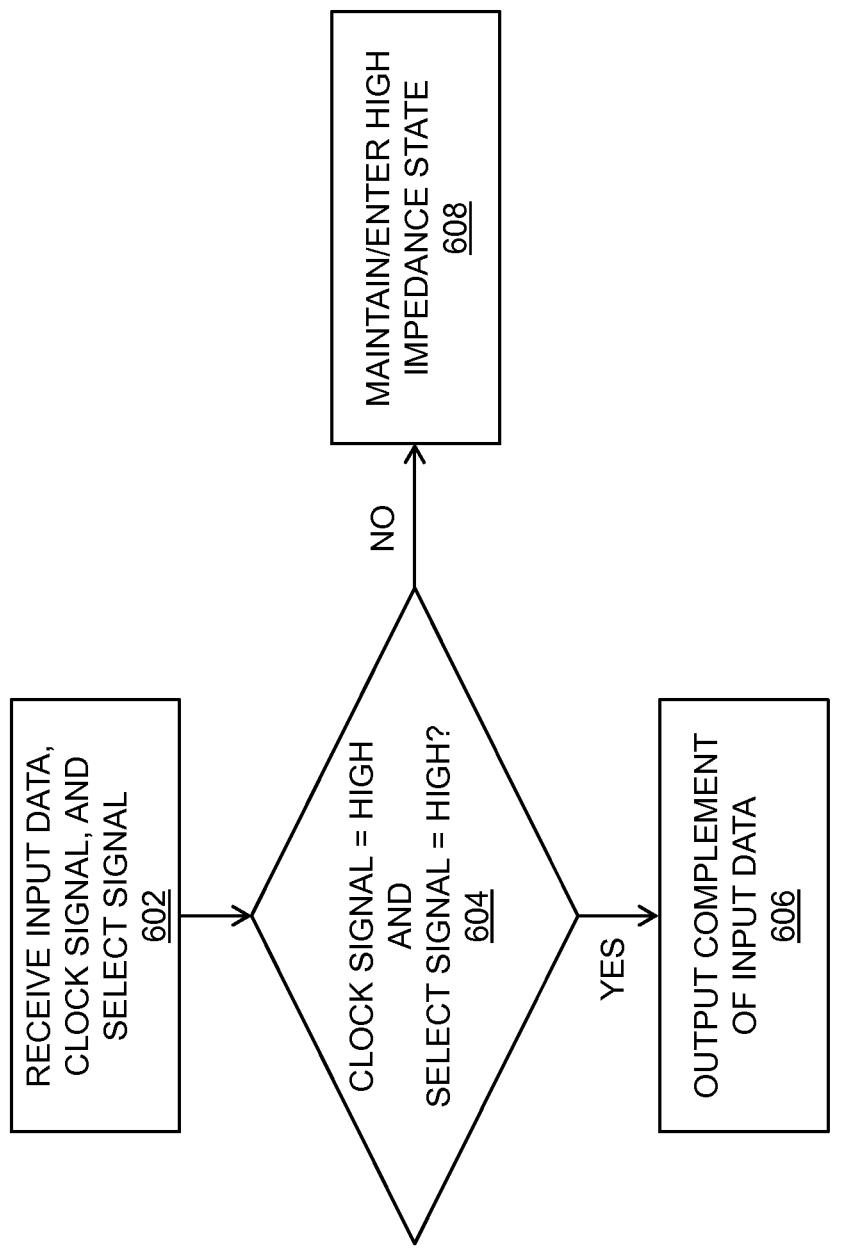
FIG. 6 is a flowchart of a method of operating a dynamic DFF having a single phase clock and a select input according to an embodiment.

FIG. 6 illustrates a method 600 of operating a multiplexing cell. The multiplexing cell may be the DFF 520 shown in FIG. 5. Returning to FIG. 6, the method 600 may receive an input data, a clock signal CLK, and a select signal SEL (602). The method may then determine whether CLK is high and SEL is high (604). If CLK is high and SEL is high, the method may output a complement of the input data (606). Otherwise, the method 600 may maintain or enter a high impedance mode (608).

FIG. 7A is a simplified schematic of a 4:1 serializer 700 including a dynamic DFF having a single phase clock and a select input by way of non-limiting embodiment. The 4:1 serializer may use quarter rate clocks. The serializer 700 may include four calibrated clocks spaced by one unit interval (UI) may be used as further described herein. That is, the serializer 700 need not use a full rate data clock. A full rate data clock is more costly and power hungry compared with sub-rate data clocks. Thus, the serializer 700 may consume less power and have relaxed speed requirements for its clocks compared with conventional full clock rate serializers.

The serializer 700 may include four multiplexing cells 701-704 and an inverter 705. The multiplexing cells (referred to as "DFFs") may be implemented according to the methods and systems described herein. In an embodiment, each of the DFFs 701-704 is implemented as a DFF 520. Each DFF may include an input for receiving input data D, an input for receiving a clock signal CLK, an input for receiving a selection signal SEL, and an output for outputting a signal Qb.

As shown, each of the clocks may be quarter rate clocks. The rising edges of the clocks may be spaced at 1UI, i.e. 90°: CLK0, CLK90, CLK180, and CLK270. Each DFF 701-704 may use as CLK input one of the four quarter rate clocks.

The SEL input may be controlled by one of the complementary versions of the clocks. For example, the DFF 701 may use CLK0 as CLK input and CLK90b as SEL input. The DFF 702 may use CLK90 as CLK input and CLK180b as SEL input. The DFF 703 may use CLK180 as CLK input and CLK270b as SEL input. The DFF 704 may use CLK270 as CLK input and CLK0b as SEL input.

The outputs Qb of each of the DFFs 701-704 may be tied together. An inverter 705 may condition the output signal by removing any unwanted transients or artifacts. The conditioned output signal is shown as d[n]. In an alternative embodiment, the output signal may be conditioned by a component such a comparator or a Schmitt trigger (not shown). In an embodiment, the operation of the serializer 700 relies on the rising edges of the clocks input to its constituent DFFs and need not rely on falling edges of the clocks, as further discussed herein.

FIG. 7B is a timing diagram 750 corresponding to the serializer 700 and by way of non-limiting embodiment. The timing diagram 750 shows input data streams, d[4n], d[4n+1], d[4n+2], and d[4n+3]. As shown, each of the data streams may be input to a respective DFF 701-704. For example, d[4n] may be input to the DFF 701, d[4n+1] may be input to the DFF 702, d[4n+2] may be input to the DFF 703, and d[4n+3] may be input to the DFF 704. The timing diagram 750 also shows CLK signals CLK0, CLK90, CLK180, and CLK270. Each of the CLK signals may be input to a respective DFF 701-704 as shown. For simplicity, the complementary clocks (SEL) are not shown in the timing diagram 750. The timing diagram also shows an output signal, d[n].

At 752, CLK0 is high, CLK90 is low, CLK180 is low, and CLK270 is high. Thus, the DFFs 702 and 703 are in a high impedance state because their respective clocks are low. The DFF 704 is in a high impedance state because its SEL is low (CLK0b is low). The DFF 701 outputs a complement of its input because its CLK is high and its SEL is high. In particular, at some time before 752, d[4n] takes on the value d[0] and there is a positive transition of CLK0. The positive transition of CLK and the input d[0] causes the DFF 701 to output a complement of d[0]. This output is then inverted (e.g., by the inverter 705), causing d[n] to be d[0] between times 752 and 754.

At 754, CLK0 is high, CLK90 is high, CLK180 is low, and CLK270 is low. Thus, the DFFs 703 and 704 are in a high impedance state because their respective clocks are low. The DFF 701 is in a high impedance state because its SEL is low (CLK90b is low). The DFF 702 outputs a complement of its input because its CLK is high and its SEL is high. In particular, at some time before 754, d[4n+1] takes on the value d[1] and there is a positive transition of CLK90. The positive transition of CLK and the input d[1] causes the DFF 702 to output a complement of d[1]. This output is then inverted (e.g., by the inverter 705), causing d[n] to be d[1] between times 754 and 756.

At 756, CLK0 is low, CLK90 is high, CLK180 is high, and CLK270 is low. Thus, the DFFs 701 and 704 are in a high impedance state because their respective clocks are low. The DFF 702 is in high impedance because its CLK is high and its SEL is low (CLK180b is low). The DFF 703 outputs a complement of its input because its CLK is high and its SEL is high. Here, the most recent positive edge transition of the CLK controls the output of the serializer 700. The most recent positive edge prior to 756 is the transition of CLK180 from low to high. In other words, output DFF 703 controls the output of serializer 700. In particular, at some time before 756, d[4n+2] takes on the value d[2] and there is a positive transition of CLK180. The positive transition of CLK and the input d[2] causes the DFF 703 to output a complement of d[2]. This output is then inverted (e.g., by the inverter 705), causing d[n] to be d[2] between times 756 and 758.

At 758, CLK0 is low, CLK90 is low, CLK180 is high, and CLK270 is high. Thus, the DFFs 701 and 702 are in a high impedance state because their respective clocks are low. The DFF 703 is in a high impedance state because its SEL is low. The DFF 704 outputs a complement of its input because its CLK is high and its SEL is high. In particular, at some time before 758, d[4n+3] takes on the value d[3] and there is a positive transition of CLK270. The positive transition of CLK and the input d[3] causes the DFF 704 to output a complement of d[3]. This output is then inverted (e.g., by the inverter 705), causing d[n] to be d[3] between 758 and the next transition.

One of ordinary skill in the art would appreciate that the depicted timing diagram is not the only possible one. Depending on a speed of the circuit and on hold/setup times of the DFFs, the data signals driving each of the four DFFs may be re-synchronized with different clock signals. The concepts described herein may be extended to other M values. For example, the serializer 700 may be implemented for any value of M≥2. This is further discussed herein, e.g., with respect to FIG. 11A.

In an embodiment, the timing diagram in FIG. 7B is based on each of the clocks having an approximately 50% duty cycle. Extreme duty cycle values are also possible. Embodiments of the present disclosure are able to handle extreme duty cycle values and need not rely on falling edges to provide accurate serialization of data while consuming relatively low power as further described herein.

FIG. 8A is a timing diagram 800 illustrating one type of unbalanced clock signal, i.e., a clock having a duty cycle variation. The timing diagram 800 shows unbalanced clock signals waveforms for a 4:1 serializer having a duty cycle less than 50%. The four clocks have a relatively small duty cycle value such that the clock signal for each DFF trips low before the corresponding SEL signals go low. As shown in the timing diagram 700, this behavior does not affect the operation of the 4:1 serializer because the output of each DFF enters the high impedance state before the next DFF actively drives the common output node d[n].

FIG. 8B is a timing diagram 850 illustrating another type of unbalanced clock signal. The timing diagram 750 shows unbalanced clock signals waveforms for a 4:1 serializer having a duty cycle above 50%. The four clocks have a relatively large duty cycle value such that the SEL signal for each of the DFFs is still low when the corresponding CLK signal triggers from low to high. This may be undesirable because the serial output data is synchronized by their falling edges rather than by their more accurate rising edges. This may increase random jitter and/or duty cycle distortion (DCD) jitter. In the general case of a 1/M rate clock, M:1 serializer, if the duty cycle of the M clocks satisfies the following relationship, the undesirable behavior may be eliminated.

$$\text{duty} < \frac{T_{clk} - UI}{T_{clk}} = 1 - \frac{UI}{T_{clk}} = 1 - \frac{1}{M} \quad (1)$$

For a quarter rate clock, 4:1 serializer, the relationship (1) is satisfied if the duty cycle of each of the clocks is less than 75%. For a half rate clock, 2:1 serializer, the relationship (1) is satisfied if the duty cycle of the clock is less than 50%.

In another aspect, embodiments of the present disclosure provide equalization to offset effects of channel imperfections. Channel imperfections may make data recovery more difficult. Equalization may be performed at a receiver side and/or a transmitter side to compensate for channel imperfections. For example, a transmitter may perform feed-forward equalization (FFE). Most of higher rate (e.g., ≥8 Gbps) serial data link standards require the transmitter to be able to implement 3-tap FFE. FFE may be implemented by a finite impulse response (FIR) filter with three taps. Embodiments of the present disclosure generate a one unit interval (1UI) time-delayed data stream that is compatible with FFE in a transmitter.

FIG. 9 is a simplified schematic diagram of a shift register 900 and a corresponding timing diagram 950. The shift register 900 uses a full rate clock to generate three data streams for FFE. Because d_pre[n], d_main[n], and d_post [n] are delayed with exactly 1UI (one clock cycle) relative to each other, the three DFFs have to be very fast, with small propagation delays and hold/setup times. The propagation delay of a DFF may not be compensated by adding delays in the clock path going from one DFF to the next one because the 1UI delay requirement will no longer be satisfied. In other words, the speed of a DFF is limited by technology, and therefore the shift register 900 is not capable of generating the three data streams for very high data rates.

Figure 10A:
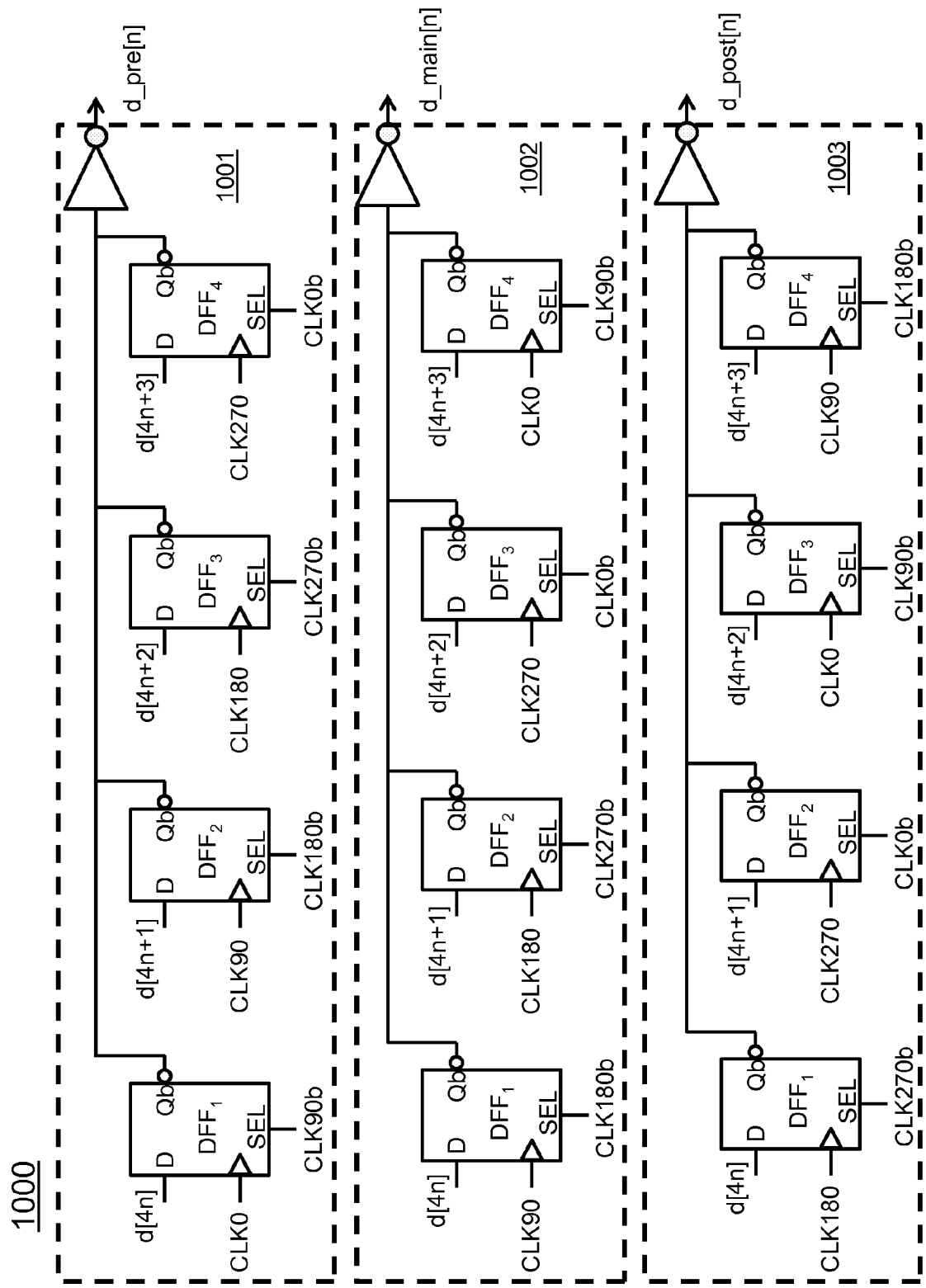
FIG. 10A is a simplified schematic diagram of 4:1 serializer generating three streams of delayed data used for transmitter equalization according to an embodiment.

FIG. 10A is a simplified schematic diagram of a 4:1 serializer system 1000 for equalization by way of non-limiting embodiment. The 4:1 serializer system 1000 is configured to generate three data streams compatible with a 3-tap equalizer. The serializer system is able to handle a variety of data rates including very high data rates.

In an embodiment, the serializer system 1000 may include a multiplexing cell ("DFF" for simplicity). Each DFF may have an input for receiving input data D, an input for receiving a clock signal CLK, an input for receiving a selection signal SEL, and an output for outputting a signal Qb. In an embodiment, the serializer system 1000 may include three separate instances of a 4:1 serializer system 1001, 1002, and 1003 running with a quarter rate clock. Each of the instances 1001, 1002, and 1003 may include DFFs (DFF$_1$-DFF$_4$). Each instance 1001, 1002, and 1003 may be driven by a same input data d[n]. Each of the instances 1001, 1002, and 1003 may have cyclically shifted CLK and SEL signals relative to each other.

FIG. 10B is a timing diagram 1050 corresponding to the serializer system 1000. The serializer system 1000 may produce an output suitable for use with equalization procedures by way of non-limiting embodiment. The data inputs to 1001, 1002, and 1003 may be re-synchronized with different clocks, to allow for enough setup and hold times for the DFFs. One of ordinary skill in the art would appreciate that the depicted timing diagram is not the only possible one. The timing diagram shows generation of d_pre[n], d_main [n], and d_post[n] signals. Each of the signals may be generated based on the concepts explained with respect to FIG. 7A and FIG. 7B.

Figure 11A:
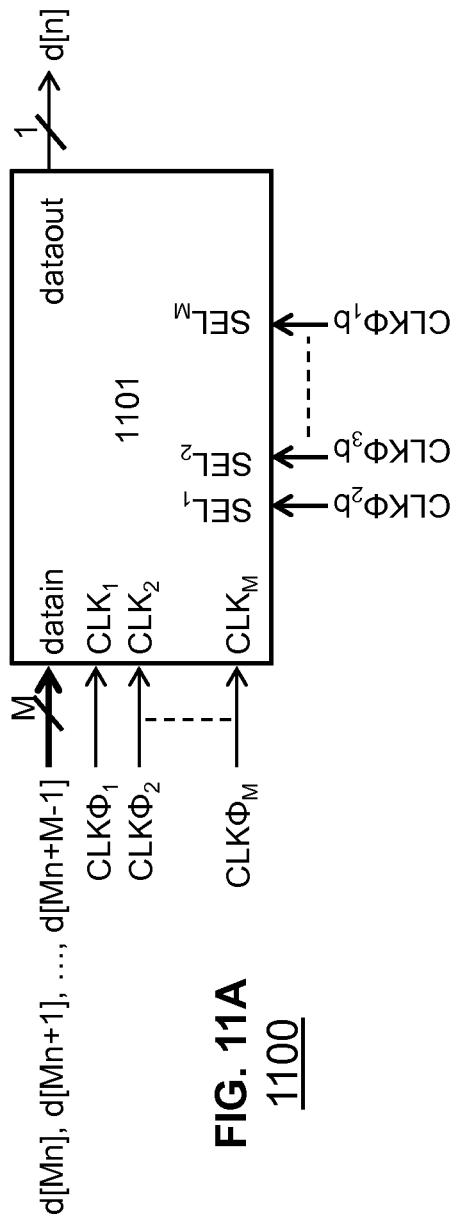
FIG. 11A is a simplified block diagram of an M:1 serializer including a dynamic multiplexing cell according to an embodiment.

FIG. 11A is a simplified block diagram of an M:1 serializer 1101 including one or more dynamic DFFs each having a single phase clock and a select input by way of non-limiting embodiment. The M:1 serializer 1101 may include M DFFs receiving inputs (d[Mn], d[Mn+1], . . . , d[Mn+ M−1]). Each DFF may have an input for receiving input data D, an input for receiving a clock signal CLK, an input for receiving a selection signal SEL, and an output for outputting a signal Qb. The outputs of the M DFFs may be tied together and a global output inverter may condition the outputs to generate a serial output d[n]. In an embodiment, the system 1100 may include M clocks with frequency equal to the full rate divided by M. The M clocks (CLK$_1$, CLK$_2$, . . . , CLK$_M$) may have phases equally spaced between 0° and 360°, $$\Phi_k = k\frac{360}{M}, k = 1, \ldots, M,$$

their rising edges being delayed by 1UI. The SEL signals (SEL$_1$, SEL$_2$, . . . , SEL$_M$) for the M DFFs may be the complementaries of corresponding clocks.

Figure 11B:
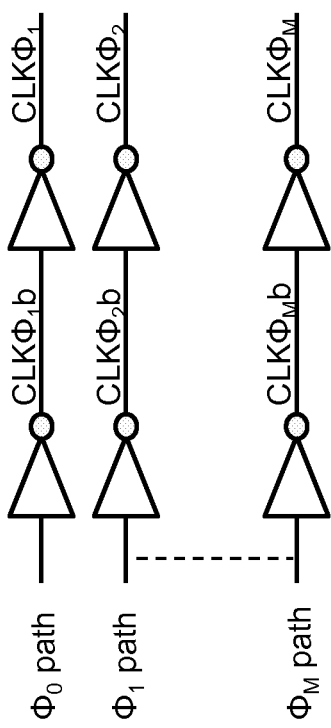
FIG. 11B is a simplified block diagram of clock distribution circuitry for an M:1 serializer according to an embodiment.

FIG. 11B is a simplified block diagram of clock distribution circuitry 1150 corresponding to the serializer 1101 by way of non-limiting embodiment. In an embodiment, simultaneous driving of a common output node may be avoided by slightly advancing a complementary clock compared with a main clock, as shown in FIG. 11B. This allows for one DFF to first enter a high impedance state before the DFF begins to actively drive the output node.

Although the foregoing description includes several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

The present specification describes components and functions that may be implemented in particular embodiments which may operate in accordance with one or more particular standards and protocols. However, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures.

In addition, in the foregoing Detailed Description, various features may be grouped or described together the purpose of streamlining the disclosure. This disclosure is not to be interpreted as reflecting an intention that all such features are required to provide an operable embodiment, nor that the claimed embodiments require more features than are expressly recited in each claim. Rather, as the following claims reflect, subject matter may be directed to less than all of the features of any of the disclosed embodiments. Thus, the following claims are incorporated into the Detailed Description, with each claim standing on its own as defining separately claimed subject matter.

Also, where certain claims recite methods, sequence of recitation of a particular method in a claim does not require that that sequence is essential to an operable claim. Rather, particular method elements or steps could be executed in different orders without departing from the scope or spirit of the invention.

What is claimed is:

1. A multiplexing cell comprising:
   a first stage for receiving an input signal and a clock signal;
   a second stage for receiving the clock signal and a select signal; and
   an output stage to receive the clock signal and the select signal;
   wherein the output stage is configured to output a signal responsive to a determination that the clock signal and the select signal are both high; and
   wherein the output signal is a complement of the input signal.

2. The multiplexing cell of claim 1, wherein the multiplexing cell is in a high impedance state if (i) the clock signal is low or (ii) the clock signal is high and the select signal is low.

3. The multiplexing cell of claim 1, wherein the clock signal and the select signal are both high for less than a full clock cycle.

4. The multiplexing cell of claim 1, wherein the clock input has a duty cycle less than 1−(UI/Tclk), where Tclk represents the clock cycle and UI represents a unit interval.

5. The multiplexing cell of claim 1, wherein the first stage includes a first transistor, a second transistor, and a third transistor;
   wherein the first and third transistors each includes a gate for receiving the input signal; and
   wherein the second transistor includes a gate for receiving the clock signal.

6. The multiplexing cell of claim 1, wherein the select signal is offset from the clock signal such that the multiplexing cell is a dynamic flip flop controlled by a rising edge of the clock signal and a falling edge of the select signal without using a falling edge of the clock signal.

7. The multiplexing cell of claim 5, wherein the second stage includes a fourth transistor, a fifth transistor, a sixth transistor, and a seventh transistor;
   wherein the fourth and seventh transistors each includes a gate for receiving the clock signal;
   wherein the sixth transistor includes a gate for receiving the select signal; and
   wherein an output of the first stage is coupled to a gate of the fifth transistor.

8. The multiplexing cell of claim 7, wherein the output stage includes an eighth transistor, a ninth transistor, a tenth transistor, an eleventh transistor, and a twelfth transistor;
   wherein the eighth transistor and the tenth transistor each includes a gate for receiving the select signal;
   wherein the eleventh transistor includes a gate for receiving the clock signal;
   wherein an output of the second stage is coupled to a gate of the ninth transistor; and
   wherein the gate of the ninth transistor is coupled to a gate of the twelfth transistor.

9. The multiplexing cell of claim 8, wherein sources of each of the first, fourth, and eighth transistors are coupled to a supply voltage; and
wherein sources of each of the third, seventh, and twelfth transistors are coupled to ground.

10. A serializer to receive data in parallel and output serial data, the serializer comprising:
a first multiplexing cell to receive a first input data stream, the first multiplexing cell including:
a first clock input to receive a first clock signal;
a first selection input to receive a first select signal; and
a first output; and
a second multiplexing cell to receive a second input data stream, the second multiplexing cell including:
a second clock input to receive a second clock signal;
a second selection input to receive a second select signal; and
a second output;
wherein each of the first and second multiplexing cells includes a respective first stage, a respective second stage, and a respective output stage;
wherein:
(i) the respective first stage of the first multiplexing cell receives the first input data stream and the first clock signal, and each of the respective second and output stages of the first multiplexing cell receives the first clock signal and the first select signal; and
(ii) the respective first stage of the second multiplexing cell receives the second input data stream and the second clock signal, and each of the respective second and output stages of the second multiplexing cell receives the second clock signal and the second select signal;
wherein the first and second multiplexing cells are each configured to output a signal responsive to a determination that the respective clock signal and the respective select signal are both high; and
wherein (i) the first multiplexing cell is in a high impedance mode while the second multiplexing cell provides the second output and (ii) the second multiplexing cell is in a high impedance mode while the first multiplexing cell provides the first output such that the parallel data is multiplexed.

11. The serializer of claim 10, wherein the first select signal is a complement of the second clock signal such that the first and second multiplexing cells are each controlled by a rising edge of the respective clock signal and a falling edge of the respective select signal without using a falling edge of the respective clock signal.

12. The serializer of claim 10, wherein the first clock signal and the first select signal are both high for only one unit interval (UI).

13. The serializer of claim 10, wherein the first and second clock inputs have a duty cycle less than $1-(UI/Tclk)$, where Tclk represents the clock cycle and UI represents a unit interval.

14. The serializer of claim 10, wherein the serializer is configured to provide at least one output time-delayed data stream compatible with transmitter feed-forward equalization.

15. The serializer of claim 10, wherein the first clock signal is delayed compared with the second clock signal such that the first multiplexing cell enters a high impedance state prior to the second multiplexing cell actively driving an output of the serializer.

16. A method to serialize parallel data by a system including at least one multiplexing cell, the method comprising:
receiving, at a first stage of the multiplexing cell, an input data stream and a clock signal;
receiving, at a second stage and output stage of the multiplexing cell, the clock signal and a selection signal; and
outputting data, via the output stage, while the selection signal is high, wherein the data reflects a value of the input data stream at a most recent positive edge of the clock signal.

17. The method of claim 16, further comprising:
placing the at least one multiplexing cell in a high impedance state responsive to a determination that the clock signal is low.

18. The method of claim 16, further comprising:
placing the at least one multiplexing cell in a high impedance state responsive to a determination that the clock signal is high and the selection signal is low.

19. The method of claim 16, wherein the serializer system includes at least two multiplexing cells, a first one of the at least two multiplexing cells is in a high impedance mode while a second one of the at least two multiplexing cells drives the output data such that the parallel data is multiplexed.

20. The method of claim 16, wherein the select signal is offset from the clock signal such that at least one multiplexing cell is a dynamic flip flop controlled by a rising edge of the clock signal and a falling edge of the select signal without using a falling edge of the clock signal.

* * * * *